(12) United States Patent
Hartwell et al.

(10) Patent No.: US 8,030,754 B2
(45) Date of Patent: Oct. 4, 2011

(54) CHIP COOLING CHANNELS FORMED IN WAFER BONDING GAP

(75) Inventors: Peter G. Hartwell, Palo Alto, CA (US); Duncan Stewart, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 939 days.

(21) Appl. No.: 11/701,317

(22) Filed: Jan. 31, 2007

(65) Prior Publication Data
US 2008/0179736 A1 Jul. 31, 2008

(51) Int. Cl.
*H01L 23/15* (2006.01)
*H01L 23/06* (2006.01)

(52) U.S. Cl. ........ 257/705; 257/706; 257/712; 257/714; 257/715; 257/717; 257/E23.097; 438/28; 438/34; 438/122

(58) Field of Classification Search .............. None
See application file for complete search history.

(56) References Cited

U.S. PATENT DOCUMENTS

| | | | |
|---|---|---|---|
| 5,510,655 A | 4/1996 | Tanielian | |
| 5,801,442 A * | 9/1998 | Hamilton et al. | 257/714 |
| 5,804,086 A | 9/1998 | Bruel | |
| 5,870,823 A * | 2/1999 | Bezama et al. | 29/848 |
| 5,978,220 A * | 11/1999 | Frey et al. | 361/699 |
| 5,998,240 A * | 12/1999 | Hamilton et al. | 438/122 |
| 6,101,715 A * | 8/2000 | Fuesser et al. | 29/890.03 |
| 6,129,145 A * | 10/2000 | Yamamoto et al. | 165/168 |
| 6,337,794 B1 * | 1/2002 | Agonafer et al. | 361/690 |
| 6,351,384 B1 * | 2/2002 | Daikoku et al. | 361/704 |
| 6,437,981 B1 * | 8/2002 | Newton et al. | 361/700 |
| 6,754,407 B2 * | 6/2004 | Chakravorty et al. | 385/14 |
| 6,780,678 B2 * | 8/2004 | Simon et al. | 438/122 |
| 6,942,018 B2 * | 9/2005 | Goodson et al. | 165/80.4 |
| 7,139,172 B2 | 11/2006 | Bezama et al. | |
| 7,219,715 B2 * | 5/2007 | Popovich | 165/80.4 |
| 7,355,277 B2 * | 4/2008 | Myers et al. | 257/712 |
| 7,407,083 B2 * | 8/2008 | Rogers | 228/121 |
| 7,485,957 B2 * | 2/2009 | Brandenburg et al. | 257/714 |
| 2005/0139996 A1 | 6/2005 | Myers et al. | |
| 2006/0180924 A1 | 8/2006 | Andry et al. | |

FOREIGN PATENT DOCUMENTS
WO WO02/078056 10/2002
* cited by examiner

*Primary Examiner* — Zandra Smith
*Assistant Examiner* — Khanh Duong

(57) ABSTRACT

One embodiment in accordance with the invention is a system that can include a first wafer and a second wafer. The first wafer and the second wafer can be bonded together by a wafer bonding process that forms a gap between the first wafer and the second wafer. The gap can be configured for receiving a heat extracting material.

10 Claims, 11 Drawing Sheets

CHIP COOLING CHANNELS FORMED IN WAFER BONDING GAP

CROSS-REFERENCE TO RELATED APPLICATIONS

The present patent application is related to co-pending U.S. patent application Ser. No. 11/701,314 entitled "Electronic And Optical Circuit Integration Through Wafer Bonding" by Peter G. Hartwell et al., filed Jan. 31, 2007, which is incorporated herein by reference.

BACKGROUND

As conventional high performance integrated circuit chips are fabricated smaller and smaller, the reduced form factor can result in an increase of power density within these smaller devices. As such, a high-performance integrated circuit chip can generate large amounts of heat which can negatively affect the operation and performance of the device.

Many conventional solutions have been developed to aid heat extraction from a high-performance integrated circuit chip. For example, heat sinks and fans have been attached directly to the integrated circuit chips. However, the heat sinks and fans may need to be large to provide effective cooling and may be incompatible with mobile computing solutions. Another conventional solution is to couple thermoelectric coolers to the integrated circuit chip, but this solution can be expensive. Yet another conventional solution involves fluid cooling schemes, but typically such schemes are not effective enough to extract the required amount of generated heat.

Therefore, it is desirable to address one or more of the above issues.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

Figure 1A:
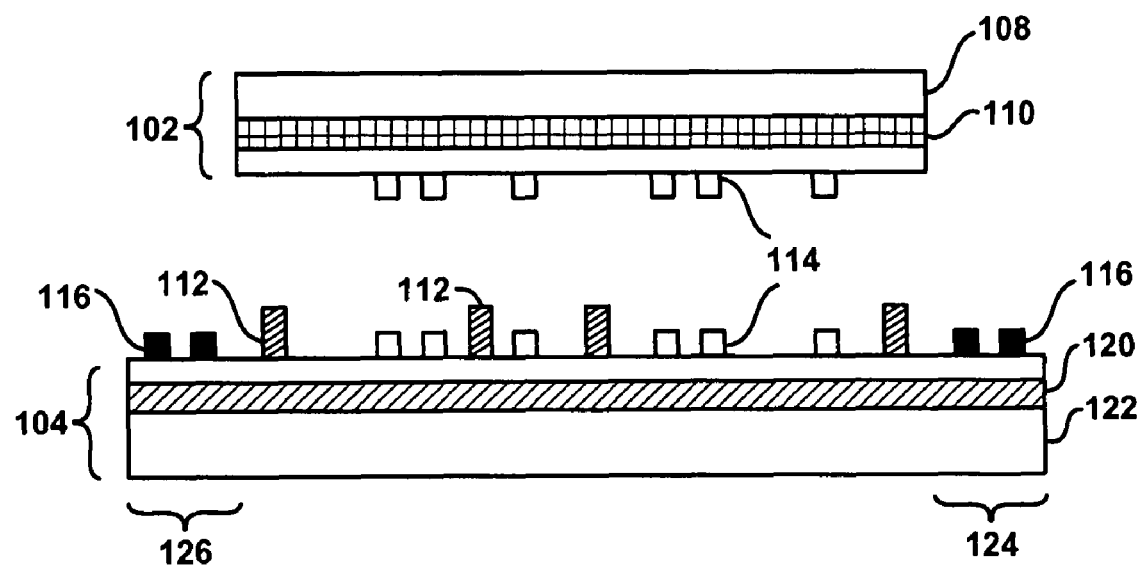
FIG. 1A is a cross section side view of two wafers before a wafer bonding process in accordance with various embodiments of the invention.

FIG. 1A is a cross section side view of two wafers before a wafer bonding process in accordance with various embodiments of the invention. Specifically, FIG. 1A illustrates an exemplary cap wafer 102 and an exemplary integrated circuit (IC) wafer 104 before a wafer bonding process. It is pointed out that one or more bonding materials 114 can be deposited or implemented on each of the cap wafer 102 and the integrated circuit wafer 104 in preparation for the wafer bonding process. Furthermore, one or more dielectric gap setting materials 112 can be deposited or implemented on the integrated circuit wafer 104 in preparation for the wafer bonding process. Specifically, during the wafer bonding process, one of the purposes of the one or more dielectric gap setting materials 112 can be to maintain and form a particular distance (or gap) between the cap wafer 102 and the integrated circuit wafer 104.

Figure 1B:
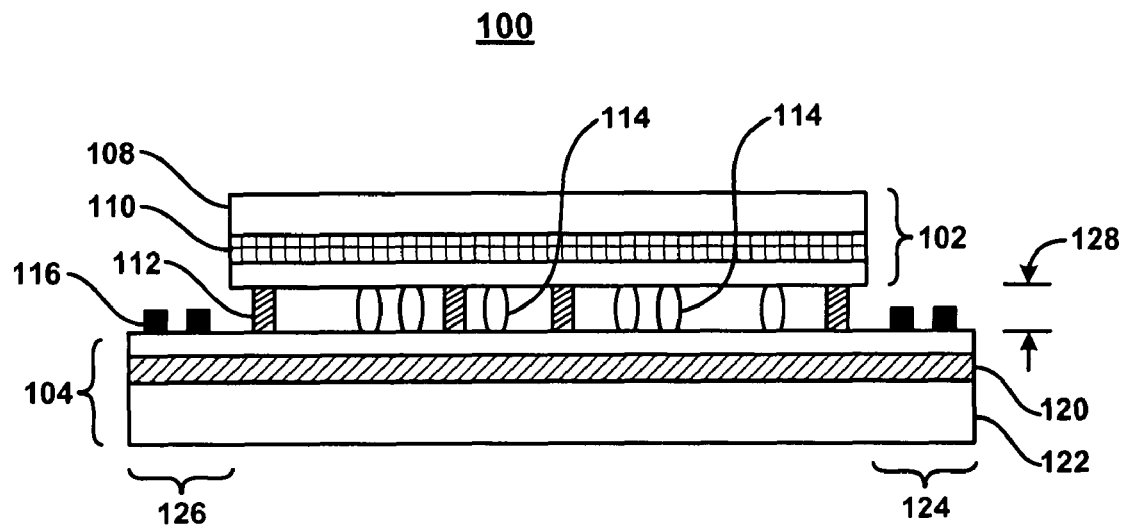
FIG. 1B is a cross section side view of an exemplary chip in accordance with various embodiments of the invention.
Figure 2:
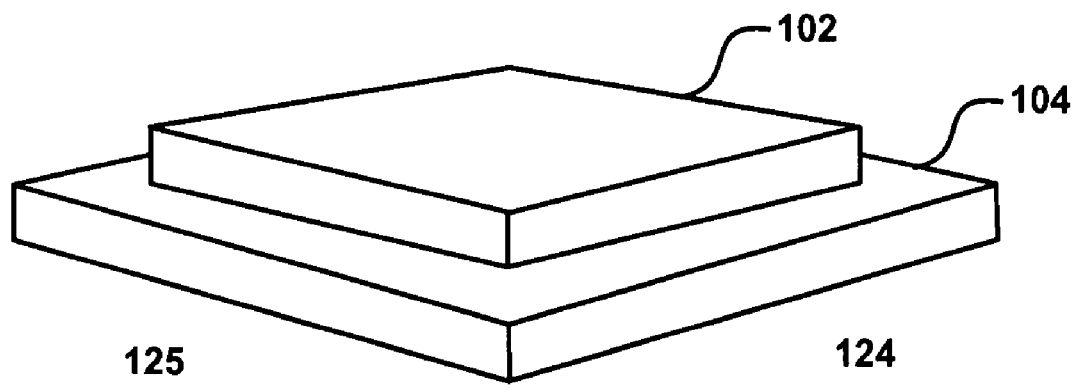
FIG. 2 is an exemplary perspective view of a chip (or apparatus) in accordance with various embodiments of the invention.

FIG. 1B is a cross section side view of an exemplary chip (or apparatus) 100 in accordance with various embodiments of the invention that includes a gap 128 formed between wafers 102 and 104 during a wafer bonding process that can be used for receiving a heat extracting material. It is noted that the heat extracting material can be implemented in any manner similar to that described herein, but is not limited to such. The chip 100 can include the cap wafer 102 and the integrated circuit wafer 104, wherein the cap wafer 102 and the integrated circuit wafer 104 are bonded together by a wafer bonding process. The wafer bonding process can form one or more channels in the gap 128 that can be used to flow a heat extracting material (or coolant material) to extract heat from the wafers (or chips) 102 and 104. It is pointed out that FIG. 2 illustrates some exemplary channels 206 in accordance with various embodiments of the invention.

The wafer bonding process can include, but is not limited to, eutectic bonding, compression bonding, fusion bonding, solder bonding, anodic bonding, plasma assisted bonding, and/or adhesive bonding. The integrated circuit wafer 104 can also be referred to as an electronic circuit wafer 104 or an electrical circuit wafer 104, but is not limited to such. The heat extracting material can also be referred to as, but is not limited to, a coolant material or a coolant, and vice versa. Additionally, the heat extracting material can be implemented in any manner similar to that described herein, but is not limited to such. In one embodiment, the wafer bonding process can include one or more bonds 114 that can couple the cap wafer 102 and the integrated circuit wafer 104 while also providing electrical interconnects between the cap wafer 102 and the integrated circuit wafer 104. It is pointed out that in various embodiments, the cap wafer 102 can include one or more circuits 110. For example in one embodiment, the one or more circuits 110 of the cap wafer 102 can include, but is not limited to, mechanical, optical, and/or additional electrical components that may enhance the capabilities of the integrated circuit wafer 104. For example, the optical components can include one or more photodetectors, electronic optical modulators (EOMs), optical waveguides, lasers, and/or electrical circuitry, but is not limited to such. However, the cap wafer 102 can be implemented such that it does not include any components. The cap wafer 102 can be implemented as, but is not limited to, an optical wafer, a mechanical wafer, an electrical wafer, or a lid wafer that does not include any components. In an embodiment, the integrated circuit wafer 104 can include one or more protrusions or "shelves" (e.g., 124 and 126) that project beyond the cap wafer 102, wherein the one or more protrusions can include one or more electrical bond pads 116 (e.g., for off-chip connections). In one embodiment, the integrated circuit wafer 104 can include one or more circuits 120, which can be electrical and/or optical, but is not limited to such. The one or more circuits 120 of the integrated circuit wafer 104 can include one or more active circuit elements, passive circuit elements, memory elements, programmable circuit elements, central processing units (CPUs), multi-core CPUs, field programmable gate arrays (FPGAs), and/or dynamic random access memories (DRAMs), but is not limited to such.

Within FIG. 1A, in one embodiment, the cap wafer 102 and the integrated circuit wafer 104 can each be fabricated on a different wafer and then be brought together after each is complete by bonding them together. For example in one embodiment, the integrated circuit wafer 104 can be fabricated in a standard process in a wafer fabrication facility and can be modified with a few additional operations in order to prepare it for a wafer bonding process. For instance, the operations can include opening additional vias in its top passivating layer and then a seed layer of bond material can be added that can form one half of the wafer bond in one embodiment. The bond material can include dielectric material 112 and/or wafer bonding interconnect material 114, but is not limited to such.

Within FIG. 1A, another wafer (e.g., silicon wafer) can be prepared that will serve as a cap wafer 102 for the integrated circuit wafer 104. The cap wafer 102 can contain a patterned layer of bond material that can form the bond to the integrated circuit wafer 104. The bond material can include dielectric material 112 and/or wafer bonding interconnect material 114, but is not limited to such. In one embodiment, the bond material (e.g., 112 and/or 114) can be patterned to perform one or more functions, such as, but not limited to, setting the gap 128 between the cap wafer 102 and the integrated circuit wafer 104, forming areas to ensure good adhesion of wafers 102 and 104, adding wall like structures that can serve as one or more channels for the heat extracting material, and/or making one or more electrical interconnects to route signals to the cap wafer 102 if it includes one or more additional devices or functionality.

Within FIGS. 1A and 1B, in one embodiment, a combination of the wafer bonding interconnect layer 114 and also the dielectric gap setting material 112 can be utilized to form one or more channels within gap 128. It is pointed out that a wide variety of shapes can be formed with the combination of the wafer bonding interconnect material 114 and the dielectric material 112. The dielectric gap setting material 112 can be formed into any shape that would define a flow for the heat extracting material. It is noted that by mounting or forming the one or more channels for directing the flow of the heat extracting material within the gap 128 of the bonded wafers 102 and 104, the one or more channels become an intimate part of the semiconductor chip 100. Furthermore, by locating the one or more channels within gap 128, the heat extracting material can be close or proximate to the circuits (e.g., 110 and 120) and interconnects 114 of wafers 102 and 104, thereby allowing for more efficient extraction of generated heat from chip 100.

It is noted out that the bond material of the wafer bonding process may be a conductor or an insulator or a combination of both, but is not limited to such. The wafer bonding process or method that can be utilized to couple the cap wafer 102 and the integrated circuit wafer 104 can be implemented in a wide variety of ways. For example in various embodiments, the wafer bonding method can include, but is not limited to, silicon to oxide fusion bonding, silicon to oxide or oxide to oxide plasma assisted bonding, metal to oxide anodic bonding, metal to metal solder bonding, and metal to metal compression bonding. In one embodiment, a plasma assisted, solder, eutectic or compression bond may be used to prevent damage to integrated circuits of the integrated circuit wafer 104 from the high temperatures of the fusion bond or the high voltages in anodic bonding. Note that the solder, eutectic or compression bonds may include additional structures (e.g., 112) to help mechanically set the gap between the cap wafer 102 and the integrated circuit wafer 104. After bonding, in one embodiment, the cap wafer 102 can be patterned to allow access to electrical bonding pads 116 on the integrated circuit wafer 104, which can be used to route electrical signals to the pins of an IC package (not shown). Note that a scheme for this is presented in U.S. Pat. Nos. 7,042,105 and 6,955,976, which are incorporated herein by reference.

Within FIGS. 1A and 1B, in one embodiment, if the cap wafer 102 is implemented as an optical circuit wafer, the stacked arrangement of the cap wafer 102 and the integrated circuit wafer 104 can put the optical circuits directly above the electronic interconnects 114 for the best performance. In one embodiment, if the cap wafer 102 is implemented as an optical circuit wafer, off-chip interconnect can be handled in a straightforward manner for both types of signals for the cap wafer 102 and the integrated circuit wafer 104. It is pointed out that however the cap wafer 102 is implemented, in an embodiment each of the cap wafer 102 and the integrated circuit wafer 104 can be individually tested before assembly to ease troubleshooting. In one embodiment, assembly or integration of the cap wafer 102 and the integrated circuit wafer 104 can be straightforward using standard wafer bonding technology, but is not limited to such.

Within chip 100 of FIG. 1B, the integrated circuit wafer 104 (which can have electronic components) is located on the bottom and the cap wafer 102 (which can have mechanical, optical, and/or electrical components) is located on top, but is not limited to such. In an embodiment, the cap wafer 102 can be fabricated or processed using a compound semiconductor process to build its one or more electro-optical components, but is not limited to such. In one embodiment, the cap wafer 102 and the integrated circuit wafer 104 can be fabricated or processed in a CMOS (complementary metal-oxide-semiconductor) electronics process, but is not limited to such. It is noted that the cap wafer 102 and the integrated circuit wafer 104 can be wafer bonded together with a physical and electrical interconnect 114, which can hold wafers 102 and 104 together and also allows electrical signals to go from the integrated circuit wafer 104 to the cap wafer 102, and vice versa.

Note that the solder and eutectic wafer bonding methods can be implemented with low temperature (e.g., 250-350° C.). The bond material for each of these wafer bonding methods can include, but is not limited to, gold tin bond, gold germanium bond, and the like. For example, in the case of gold and tin bond, a gold layer can be deposited on a first wafer (e.g., 102) while a tin layer can be deposited on a second wafer (e.g., 104), and then the wafers 102 and 104 can be stuck together. The gold and tin can be heated up and then they inter-diffuse and bond wafers 102 and 104 together. In one embodiment, the bonding material can be deposited in a thin film manner, which can provide more precise control of the volume of bonding material. For solder and eutectic wafer bonding methods, the lead size or contact size can be approximately a 25 micron (or micrometer) circle, but is not limited to such. As previously mentioned, another wafer bonding technique can include compression bonding. For example, gold can be deposited on both the cap wafer 102 and the integrated circuit wafer 104, then pressure and substantially no heat can be applied and the gold can intermingle and provide a bond coupling together wafers 102 and 104.

Within FIGS. 1A and 1B, it is noted that the one or more gap setting materials 112 can be included within chip 100. In one embodiment, one or more gap setting materials 112 can be utilized during a compression wafer bonding process to form gap 128. In an embodiment, one or more gap setting materials 112 can be utilized during a solder or eutectic wafer bonding process to form gap 128 and to prevent the bonding material from being squeezed out from between the cap wafer 102 and the integrated circuit wafer 104.

It is pointed out that one wafer bonding technique that can be utilized in accordance with an embodiment of the invention is called anodic bonding. Specifically, anodic bonding can involve bringing wafers 102 and 104 together (e.g., with one or more gap setting materials 112 between them) and passing a current through wafers 102 and 104 and the gap setting material 112 to fuse them together. In one embodiment, it may be desirable with the anodic bonding to localize such so that the current does not pass through electronics of the cap wafer 102 and integrated circuit wafer 104. Another wafer bonding technique that can be utilized in accordance with an embodiment of the invention is called fusion bonding, which can involve depositing silicon on any gap setting materials 112 of one wafer (e.g., 102) and silicon dioxide on areas of the other wafer (e.g., 104) corresponding to any gap setting materials 112, and then bringing them together to form a bond. Yet another wafer bonding technique that can be utilized in accordance with an embodiment of the invention is called localized heating. For example in one embodiment, one or more lasers can be utilized to localize the heating at any gap setting materials 112 located between wafers 102 and 104, but is not limited to such.

Within FIG. 1B, the chip 100 can include the cap wafer 102 and the integrated circuit wafer 104, which have been wafer bonded together to form the gap 128 between them for receiving heat extracting material. In one embodiment, the wafer bonding that coupled the cap wafer 102 and the integrated circuit wafer 104 can include one or more channels for directing the flow of the heat extracting material. The cap wafer 102 can include, but is not limited to, dielectric material, a substrate 108 (e.g., silicon), one or more circuits 110 (e.g., optical and/or electronic), and one or more metal interconnects. Furthermore, the cap wafer 102 can be implemented to include gap setting material 112 (which can be referred to as a stand-off). The integrate circuit wafer 104 can include, but is not limited to, dielectric material, silicon wafer 122, one or more circuits 120 (e.g., optical and/or electronic), metal interconnects, one or more electrical bond pads 116, and one or more protrusions or "shelves" 124 and 126 that project beyond the cap wafer 102. Additionally, the cap wafer 102 and/or the integrated circuit wafer 104 can be implemented to include gap setting material 112.

FIG. 2 is an exemplary perspective view of a chip (or apparatus) 100a in accordance with various embodiments of the invention. It is pointed out that FIG. 2 illustrates that the integrated circuit wafer 104 of the chip 100a can include one or more protrusions or "shelves" (e.g., 124 and 125) that project beyond the cap wafer 102. For example, one or more sides of the integrated circuit wafer 104 can project beyond one or more sides of the cap wafer 102. However, in one embodiment, it is noted that the integrated circuit wafer 104 of the chip 100a can be implemented without any protrusions or "shelves" (e.g., 124 and 125) that project beyond the cap wafer 102. As such, in this embodiment, the integrated circuit wafer 104 and the cap wafer 102 can be of substantially similar size, wherein their corresponding sides can be substantially flush.

Figure 3:
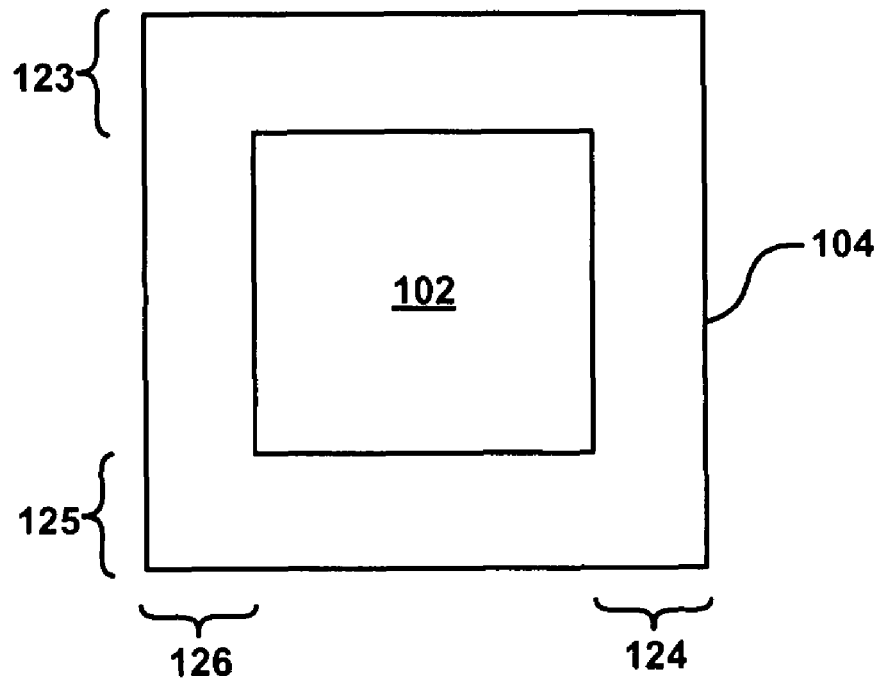
FIG. 3 is an exemplary plan view of a chip (or apparatus) in accordance with various embodiments of the invention.

FIG. 3 is an exemplary plan view of a chip (or apparatus) 100b in accordance with various embodiments of the invention. Specifically, in one embodiment, the integrated circuit wafer 104 can include protrusions or "shelves" 123, 124, 125, and 126 on four of its sides that can project beyond the four sides of the cap wafer 102. However, in various embodiments, the integrated circuit wafer 104 can include one or more protrusions 123, 124, 125, and/or 126 that can project beyond the sides of the cap wafer 102. Note that one or more of the protrusions 123, 124, 125, and 126 can be implemented in a wide variety of ways. For example in one embodiment, each of protrusions 123, 124, 125, and 126 be implemented with electronic bond pads (e.g., 116), but is not limited to such. It is pointed out that each of the protrusions 123, 124, 125, and 126 can be implemented in any manner similar to that described herein, but is not limited to such.

Figure 4:
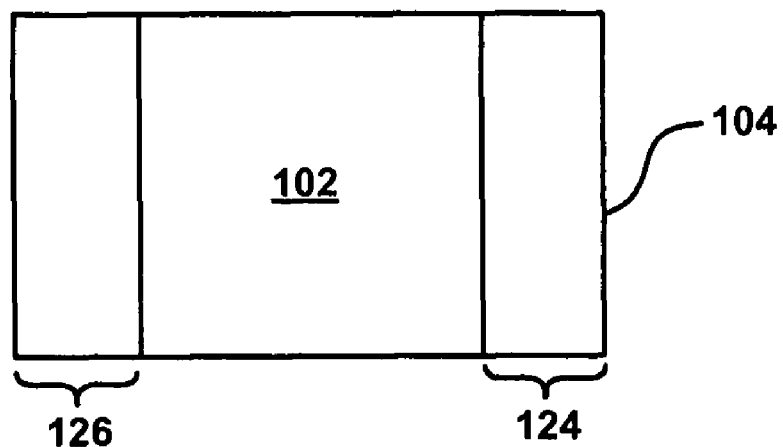
FIG. 4 is an exemplary plan view of a chip (or apparatus) in accordance with various embodiments of the invention.

FIG. 4 is an exemplary plan view of a chip (or apparatus) 100c in accordance with various embodiments of the invention. Specifically, in one embodiment, the integrated circuit wafer 104 can include protrusions or "shelves" 124 and 126 on two of its sides that can project beyond the four sides of the cap wafer 102. It is pointed out that one or more of the protrusions 124 and 126 can be implemented in a wide variety of ways. It is noted that each of the protrusions 124 and 126 can be implemented in any manner similar to that described herein, but is not limited to such.

Figure 5:
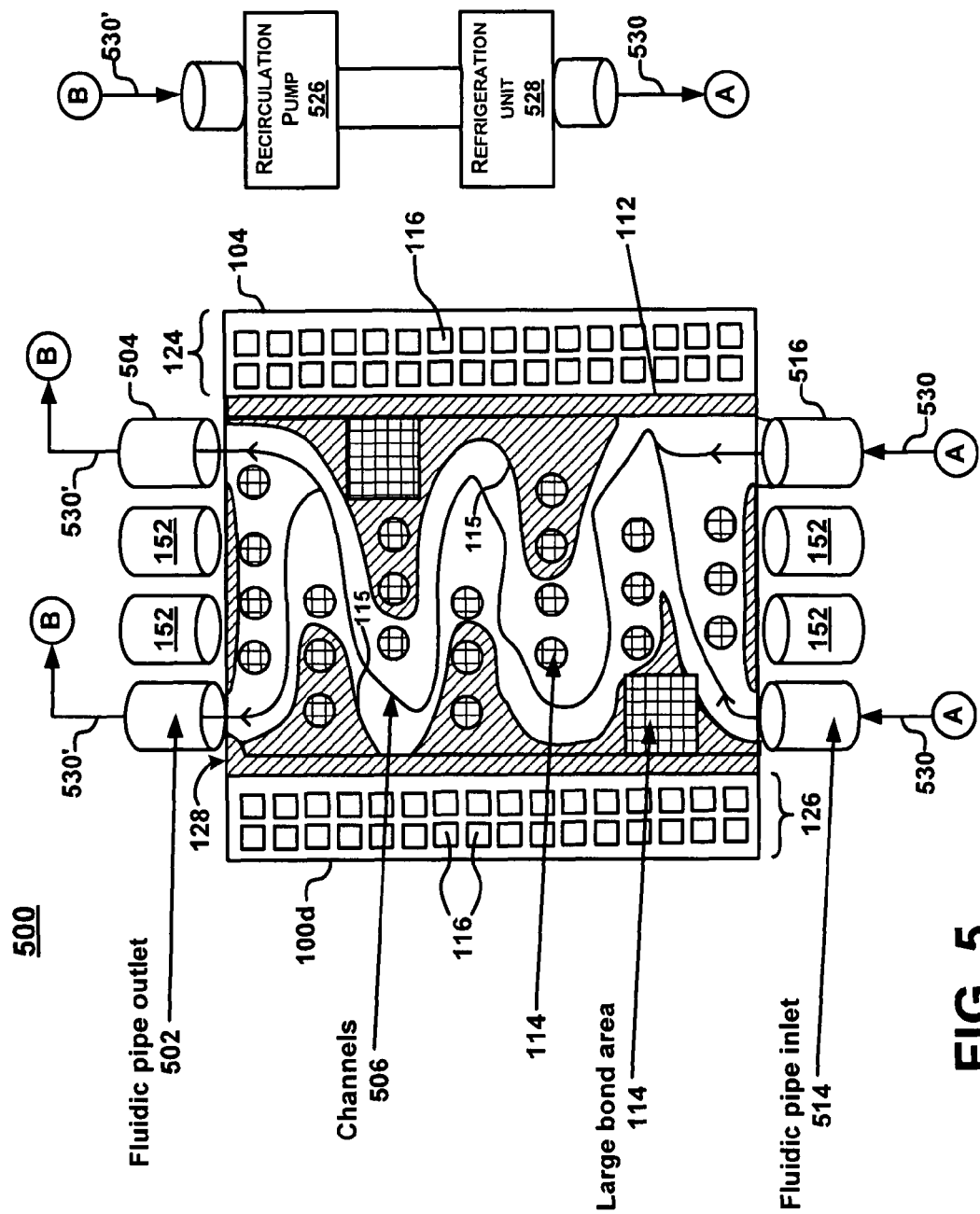
FIG. 5 is a top view of the exemplary system in accordance with various embodiments of the invention.

FIG. 5 is a top view of a system 500 in accordance with various embodiments of the invention. It is pointed out that system 500 can include a top view of chip (or apparatus) 100d, wherein exemplary contents of gap 128 are shown while the cap wafer 102 is not shown, in accordance with various embodiments of the invention. Specifically, gap 128 can include, but is not limited to, one or more wafer bonding dielectric gap setting materials 112, one or more large bond areas 114 (or 112), one or more wafer bonding interconnects 114, and one or more channels 506 for directing (or steering or guiding) the flow of the heat extracting material 530 through gap 128. Furthermore, system 500 can include, but is not limited to, one or more inlet pipes 514 (e.g., fluidic pipe inlets), one or more outlet pipes 502 (e.g., fluidic pipe outlets), a recirculation pump 526, and a refrigeration unit 528. System 500 can be a closed system for recirculating the heat extracting material 530 through the gap 128 of the chip 100d.

Within system 500, the refrigeration unit 528 lowers the temperature of the heat extracting material 530. The recirculation pump 526 can force the heat extracting material 530 that has been cooled out of the refrigeration unit 528, through the one or more inlet pipes 514 and 516, and into the one or more channels 506 of the gap 128 of chip 100d. The inlet pipes 514 and 516 (from off-chip) can be abutted to the side of chip 100d and sealed thereto such that any heat extracting material 530 flowing through them can be input into the channels 506 of the gap 128. In one embodiment, dielectric gap setting material 112 can be utilized during the wafer bonding process to seal the edges between wafers 102 and 104, except for the areas in front of pipes 502, 504, 514, and 516. In this manner, the heat extracting material 530 can be constrained so that the heat extracting material 530 that enters gap 128 through inlet pipes 514 and 516 can also exit gap 128 through outlet pipes 502 and 504 (from off-chip). Moreover, in an embodiment, the dielectric gap setting material 112 can be utilized during the wafer bonding process to form one or more surfaces and/or shapes 115 that result in the formation of the one or more channels 506. As such, the flow of the heat extracting material 530 that is input into the channels 506 can be guided or steered or directed by channels 506. Therefore, in one embodiment, the channels 506 can be formed to guide or direct the heat extracting material 530 to come in contact with hotter portions of wafer 102, wafer 104 and/or the wafer bonding interconnects 114. In an embodiment, the channels 506 can be formed to guide or direct the heat extracting material 530 to avoid coming in contact with portions of wafer 102, wafer 104 and/or the wafer bonding interconnects 114 that do not generate much heat. In one embodiment, the shape of the one or more channels 506 can be optimized to ensure flow of the heat extracting material 530 is concentrated over parts of the integrated circuit wafer 104 having the ability to generate the largest amount of heat. In this fashion, the heat extracting material 530 can remove heat from one or more components of chip 100d.

Within FIG. 5, it is noted that the recirculation pump 526 can continuously force more and more of the heat extracting material 530 that has been cooled by the refrigeration unit 528 into the channels 506 via pipes 514 and 516. As the heat extracting material 530 moves through channels 506, it can extract heat from chip 100d and the temperature of the heat extracting material 530 can increase. Therefore, an increased temperature heat extracting material 530' can be output from channels 506 of the gap 128 and into outlet pipes 502 and 504. The recirculation pump 526 can suction or draw the increased temperature heat extracting material 530' out of channels 506, through pipes 502 and 504, and force it into refrigeration unit 528 where it can be cooled down into the heat extracting material 530. In this manner, the heat extracting material 530 can be prepared to again be input into the channels 506 of the gap 128 between wafers 102 and 104.

Note that the pipes 502, 504, 514, and 516 can be implemented in a wide variety of ways. For example, each of pipes 502, 504, 514, and 516 can be implemented with a diameter of approximately 125 micrometers or microns, but is not limited to such. System 500 can be implemented with a greater or fewer number of inlet pipes than the inlet pipes 514 and 516 shown in FIG. 5. Additionally, system 500 can be implemented with a greater or fewer number of outlet pipes than the outlet pipes 502 and 504 shown in FIG. 5.

Within FIG. 5, the cap wafer 102 of system 500 can be implemented as, but is not limited to, an optical circuit wafer. As such, optical signals can be routed into cap wafer 104 via one or more optical fibers 152 from the side of the chip 100d, which is a wafer stack that can include the cap wafer 102 and the integrated circuit wafer 104. In order to facilitate the electrical and optical off-chip interface in one embodiment, electronic bond pads 116 can implemented on the protrusions or "shelves" 124 and 126 of wafer 104 of chip 100d, while the optical connections 152 can be implemented on the two other sides of chip 100d, as shown in FIG. 5. Furthermore, to facilitate the input and output interface of the heat extracting material 530 through the gap 128 in an embodiment, the pipes 502, 504, 514, and 506 can be implemented on opposite sides of chip 100d, as shown in FIG. 5. It is pointed out that one or more of the pipes 502, 504, 514, and 506 can be implemented on any side that the optical fibers 152 are implemented on, but are not limited to such.

Specifically, the integrated circuit wafer 104 of the chip 100d includes protrusions 124 and 126, which can each include one or more electrical bond pads 116. In one embodiment, as shown in FIG. 5, protrusion 126 can be located on one side of the integrated circuit wafer 104 while protrusion 124 can be located on the opposite side of the integrated circuit wafer 104. It is pointed out that protrusions 124 and 126 of FIG. 5 correspond to shelves 124 and 126 of FIGS. 1 and 4. Note that a wire (e.g., approximately 25 microns in diameter) can electrically couple each electrical bond pad 116 to a package (not shown) for the chip 100d. By limiting the electrical pads 116 to two sides of the chip 100d, the chip 100d can have no overhang or be flush on its other two sides. In this manner, in an embodiment, as shown in FIG. 5, one or more outlet pipes (e.g., 502 and 504) and one or more inlet pipes (e.g., 514 and 516) can be located right next to or abut against the flush edges of the chip 100d. Additionally, in one embodiment, as shown in FIG. 5, one or more optical fibers 152 can also be located right next to or abutted against one or more of the flush edges of the chip 100d, thereby enabling improved optical transmission between them and any optical circuits (e.g., 110) of the cap wafer 102.

Within FIG. 5, it is pointed out that chip 100d can be implemented in a wide variety of ways. For example in one embodiment, the integrated circuit wafer 104 can include a single protrusion (e.g., 124) for electrical interconnects (e.g., 116) on any of its sides while its three remaining sides can be used for inputting (e.g., 514 and 516) and outputting (e.g., 502 and 504) heat extracting material 530. Specifically, any number of inlet pipes (e.g., 514 and the like) and any number of outlet pipes (e.g., 502 and the like) can be implemented on the three remaining sides of chip 100d. In an embodiment, the integrated circuit wafer 104 can include three protrusions for electrical interconnects (e.g., 116) on any of its sides while the remaining side can be used for inputting (e.g., 514 and 516) and outputting (e.g., 502 and 504) heat extracting material 530. Specifically, any number of inlet pipes (e.g., 514 and the like) and any number of outlet pipes (e.g., 502 and the like) can be implemented on the remaining side of chip 100d.

In one embodiment, if the cap wafer 102 is implemented as an optical circuit wafer, it is pointed out that the gap 128 is at a different height than where the optical fibers 152 are going to be located. For example in an embodiment, the optical fibers 152 can be aligned or lined-up with the optical circuit layer (e.g., 110) of the cap wafer 102 while the coolant pipes 502, 504, 514, and 516 are going to lined-up with the gap 128 between the wafers 102 and 104.

Within FIG. 5, the heat extracting material 530 can be referred to as a coolant material or a coolant, but is not limited to such. It is pointed out that the heat extracting material 530 can be implemented in a wide variety of ways. For example in various embodiments, the heat extracting material 530 can be implemented as, but is not limited to, a fluid, a liquid, a gas, helium, a fluorocarbon, Freon®, Fluorinert®, any of the inert gases, a dielectric fluid, or any combination thereof. It is noted that a fluid can include a gas, a liquid, and/or a boiling liquid, but is not limited to such. In one embodiment, the heat extracting material 530 can be implemented with a material that is inert, has a wide temperature range, and reasonable heat capacity. In an embodiment, the heat extracting material 530 can be implemented with a material that is non-corrosive to any bond metal or anything exposed to the heat extracting material 530. In one embodiment, the heat extracting material 530 can be implemented with a material that is inert, has a wide temperature range, and a large heat capacity. It is noted that the heat extracting material 530 can be implemented with one or more particular optical properties along with one or more cooling properties. For example in one embodiment, if there is a photodiode in the electronics wafer 104 and across the gap 128 there is an optical waveguide path emitter in the cap wafer 102, the heat extracting material 530 can be implemented to have a high refractive index to provide containment of the light between the optical components. As such, in one embodiment, the heat extracting material 530 can have an index of refraction that enhances one or more optical performances of system 500.

It is pointed out that one or more surfaces of the channels 506 can be coated or treated with one or more different materials or processes. The purpose for coating or treating with the material(s) or processes can include, but is not limited to, controlling the flow of the heat extracting material 530, controlling the wetting of the heat extracting material 530, aiding in the heat transfer between the wafer 102 and the heat extracting material 530, aiding in the heat transfer between the wafer 104 and the heat extracting material 530, and/or preventing corrosion by the heat extracting material 530. In one embodiment, one or more surfaces of the channels 506 can be coated with a fluorinated organic layer to provide a Teflon®-like coating, which may assist in preventing corrosion. In an embodiment, one or more surfaces of the channels 506 can be coated with a thin oxide or nitride layer, which may control the wetting of the heat extracting material 530 and thus improve the heat transfer characteristics of the system. In an embodiment, one or more surfaces of the channels 506 can be treated with a process that yields a well controlled surface roughness, which may aid in controlling the fluid flow characteristics, for example by controlling the boundary layer thickness and thus the heat transfer characteristics of the system.

Within gap 128 of chip 100d, the large bond areas 114 (or 112) can be implemented to provide increased mechanical coupling or strength or adhesion for holding together the cap wafer 102 and the integrated circuit wafer 104. Note that the large bond areas 114 (or 112) can be implemented with any wafer bonding material (e.g., dielectric gap setting material and/or interconnect material).

Figure 7:
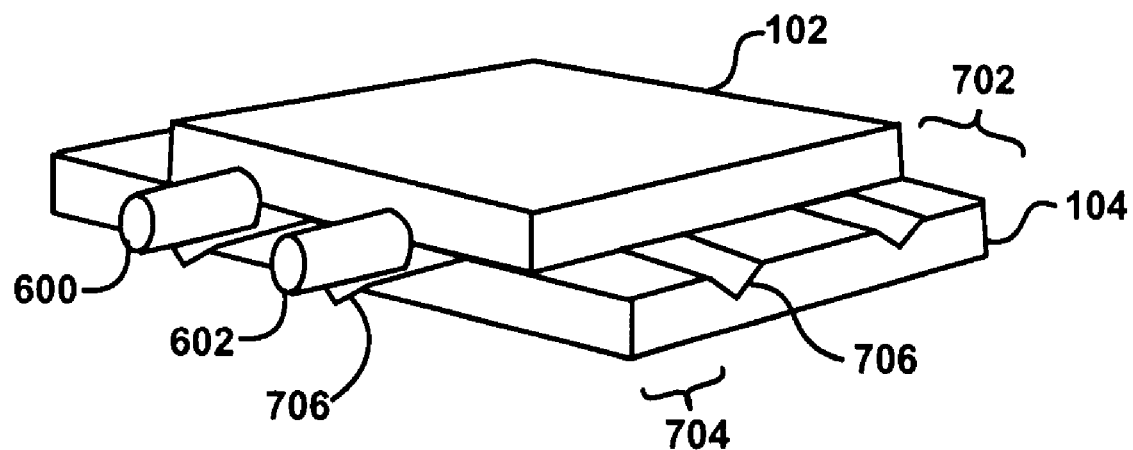
FIG. 7 is an exemplary perspective view of a chip (or apparatus) in accordance with various embodiments of the invention.

Within FIG. 5, the one or more optical fibers 152 can be implemented in a wide variety of ways. For example in one embodiment, the optical fibers 152 can each be approximately 125 microns in diameter, but is not limited to such. In one embodiment, the core of each optical fiber 152 can be aligned with any optical circuits (e.g., 110) of the cap wafer 102 to provide proper optical transmission. In one embodiment, any optical circuits (e.g., 110) of the cap wafer 102 can be implemented to be a layer that is approximately 20 microns thick, but is not limited to such. In an embodiment, the alignment of the optical fiber 152 can be implemented by the packaging for the chip 100d. For example in one embodiment, a "V" groove can be included as part of the package (e.g., as shown in FIG. 7) for chip 100d in order to align each optical fiber 152, wherein each optical fiber 152 can rest within its V-groove. In an embodiment, it is noted that one or more V-grooves can be fabricated into the integrated circuit wafer 104, wherein the optical fibers 152 can rest and be aligned with any optical circuits (e.g., 110) of the cap wafer 102.

It is pointed out that chip 100d can be implemented in a wide variety of ways. For example in one embodiment, the integrated circuit wafer 104 can include a single protrusion for electrical interconnects (e.g., 116) on any of its sides while its three remaining sides may be used for optical interconnects (e.g., 152) along with inputting and outputting the heat extracting material 530, as described herein. In an embodiment, the integrated circuit wafer 104 can include three protrusions for electrical interconnects (e.g., 116) on any of its sides while the remaining side can be used for optical interconnects (e.g., 152) along with inputting and outputting the heat extracting material 530, as described herein.

Figure 6:
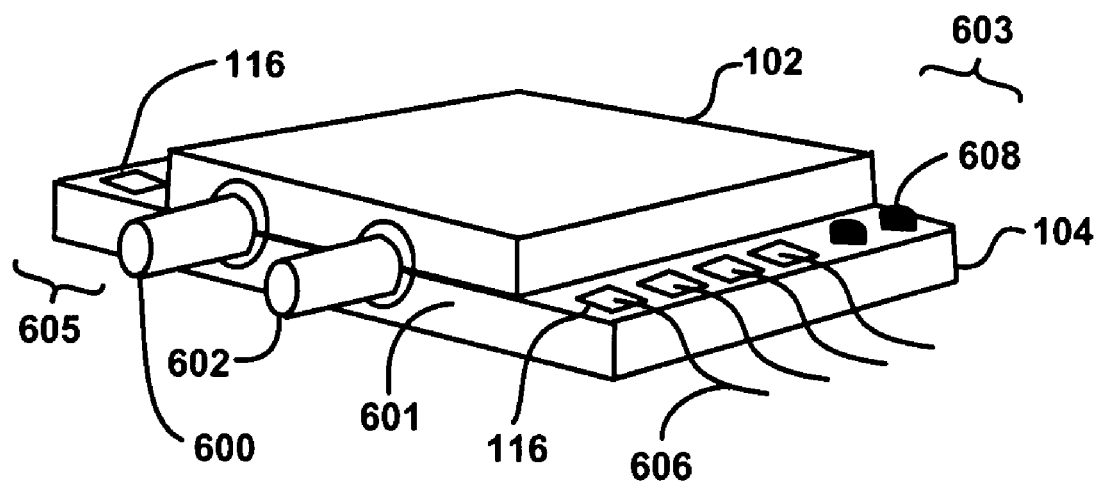
FIG. 6 is an exemplary perspective view of a chip (or apparatus) in accordance with various embodiments of the invention.

FIG. 6 is an exemplary perspective view of a chip (or apparatus) 100e in accordance with various embodiments of the invention. Specifically, FIG. 6 illustrates different off-chip connections that can be implemented with chip 100e in various embodiments. For example, the chip 100e can be implemented to include on its flush side 601 one or more fluid inlet and/or outlet pipes 600 and 602 for handling heat extracting material (e.g., 530). Furthermore, a protrusion or "shelf" 603 of the chip 100e can be implemented to include one or more bond pads 116 along with one or more solder bumps 608 for a surface mount package. It is pointed out that wire 606 can be bonded to each of the bond pads 116. Moreover, a protrusion or "shelf" 605 of the chip 100e can be implemented to include one or more bond pads 116, but is not limited to such.

FIG. 7 is an exemplary perspective view of a chip (or apparatus) 100f in accordance with various embodiments of the invention. Specifically, FIG. 7 illustrates that one or more grooves (or trenches or patterned features) 706 can be implemented within one or more protrusions or "shelves" 702 and 704 of the chip 100f in various embodiments. It is pointed out that grooves 706 can assist in the alignment of fluid inlet and/or outlet pipes 600 and 602 with the gap (e.g., 128) located between wafers 102 and 104. Furthermore, the grooves 706 can also assist in the alignment of optical fibers 152 with any optical circuit (e.g., 110) of chip 100f.

Figure 8:
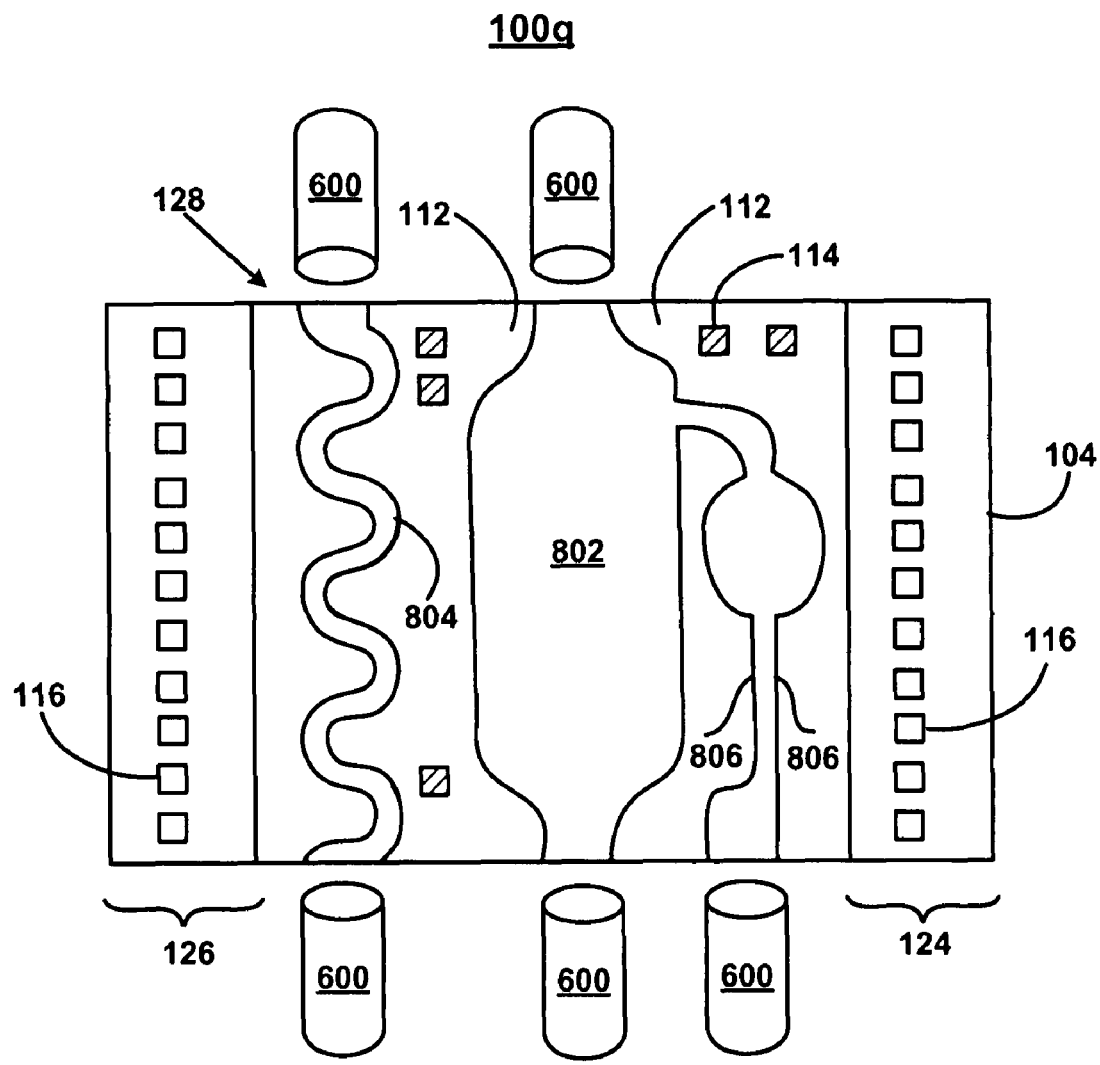
FIG. 8 is a top view of a chip (or apparatus) in accordance with various embodiments of the invention.

FIG. 8 is a top view of a chip (or apparatus) 100g in accordance with various embodiments of the invention. It is pointed out that chip (or apparatus) 100g includes exemplary contents of gap 128 while the cap wafer 102 is not shown, in accordance with various embodiments of the invention. Specifically, gap 128 can include, but is not limited to, channels 802, 804 and 806 for directing (or steering or guiding) the flow of heat extracting material (e.g., 530) through gap 128, one or more wafer bonding interconnects 114, and dielectric gap setting materials 112. Furthermore, chip 100g can include, but is not limited to, one or more fluidic inlet and/or output conduits 600 for handling the heat extracting material (e.g., 530). It is pointed out that chip 100g can be part of a system similar to system 500 of FIG. 5, but is not limited to such. Note that channels 802, 804 and 806 can be implemented in any shape and can be implemented in any manner similar to any other channels described herein, but are not limited to such. The wafer 104 can include protrusions or "shelves" 124 and 126 that project beyond wafer 102 (not shown). The protrusions 124 and 126 can each include one or more bond pads 116.

Figure 9:
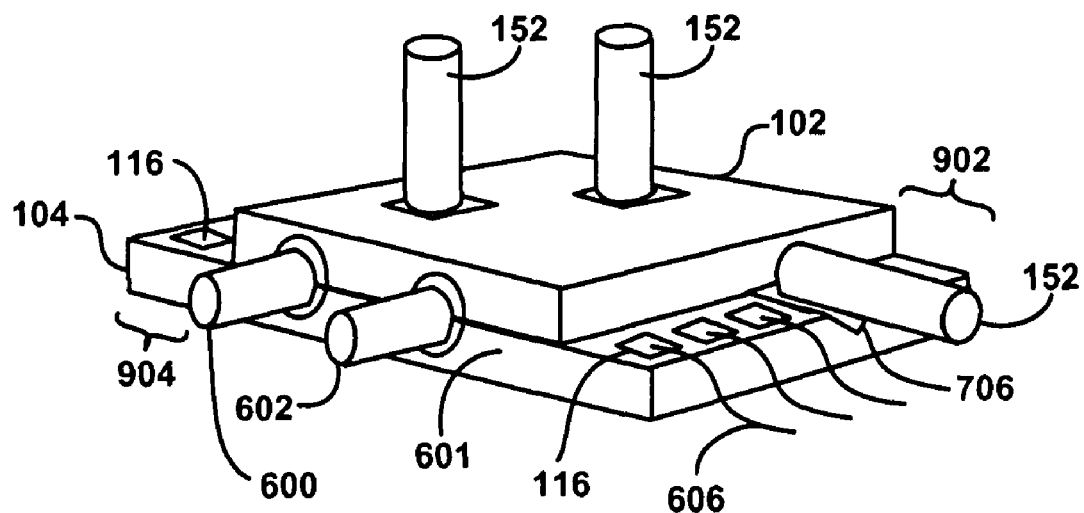
FIG. 9 is an exemplary perspective view of a chip (or apparatus) in accordance with various embodiments of the invention.

FIG. 9 is an exemplary perspective view of a chip (or apparatus) 100h in accordance with various embodiments of the invention. Specifically, FIG. 9 illustrates different off-chip connections that can be implemented with chip 100h in various embodiments. For example, the chip 100h can be implemented to include on its flush side 601 one or more fluid inlet and/or outlet pipes 600 and 602 for handling heat extracting material (e.g., 530). Moreover, a protrusion or "shelf" 902 of the chip 100h can be implemented to include one or more bond pads 116 along with a groove 706 for assisting in the alignment of an optical fiber 152, which is end-coupled to wafers 102 and/or 104. It is pointed out that wire 606 can be bonded to each of the bond pads 116. Moreover, a protrusion or "shelf" 904 of the chip 100*h* can be implemented to include one or more bond pads 116, but is not limited to such. Additionally, one or more optical fibers 152 can be surface mounted vertically to wafer 102 of the chip 100*h*. The optical fibers (or fiber-optic connecters) 152 of the chip 100*h* can be utilized to transmit light onto and off of chip 100*h*. For example in one embodiment, the optical fibers (or fiber-optic connecters) 152 of the chip 100*h* can be utilized to transmit light onto and off of wafer 102. It is noted that surface mounted lasers can be utilized as light sources for the optical fibers 152.

Figure 10:
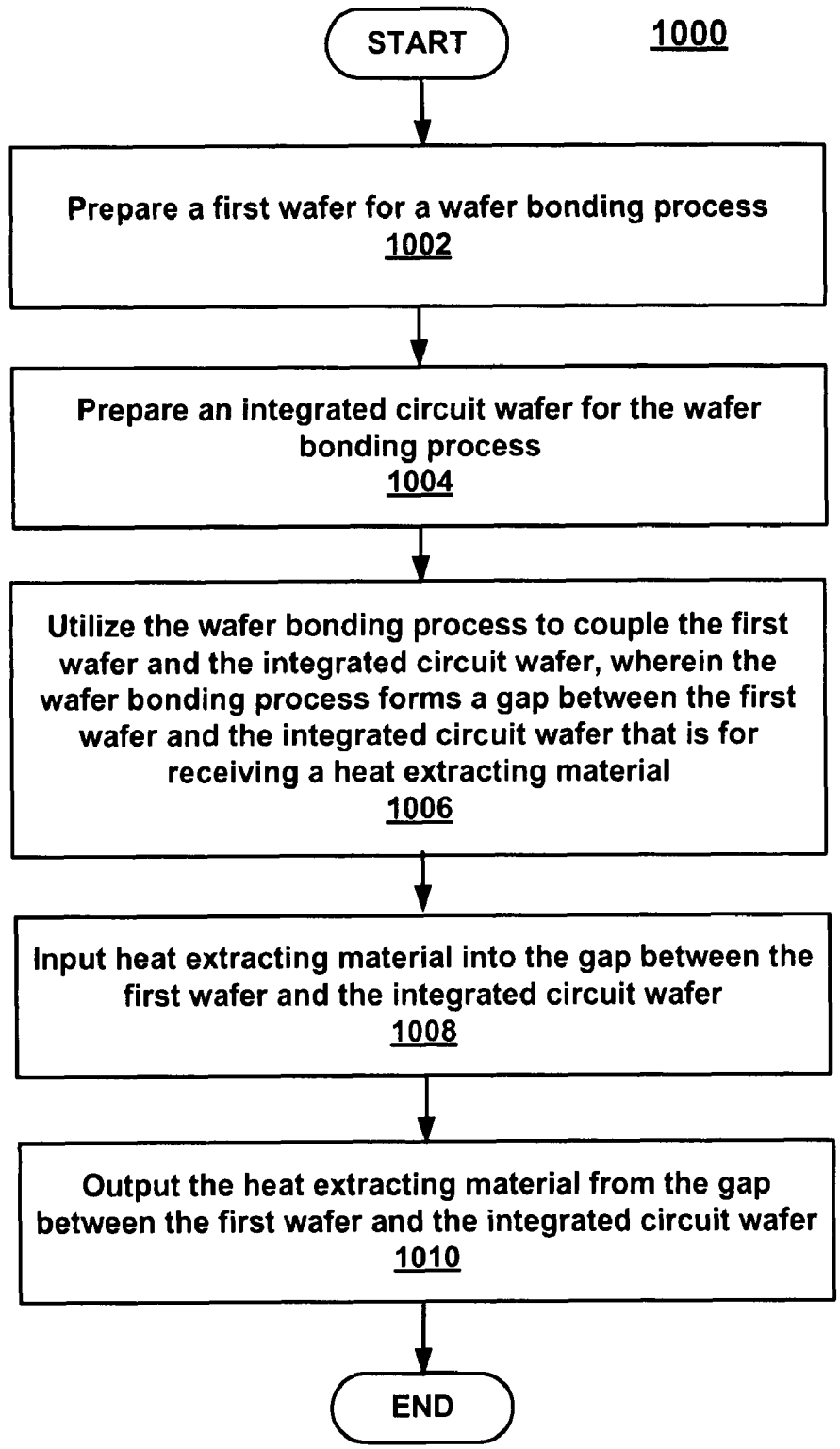
FIG. 10 is a flow diagram of an exemplary method in accordance with various embodiments of the invention.

FIG. 10 is a flow diagram of an exemplary method 1000 in accordance with various embodiments of the invention for forming and using chip cooling channels in a wafer bonding gap. Method 1000 includes exemplary processes of various embodiments of the invention that can be carried out by a processor(s) and electrical components under the control of computing device readable and executable instructions (or code), e.g., software. The computing device readable and executable instructions (or code) may reside, for example, in data storage features such as volatile memory, non-volatile memory, and/or mass data storage that can be usable by a computing device. However, the computing device readable and executable instructions (or code) may reside in any type of computing device readable medium. Note that method 1000 can be implemented with application instructions on a computer-usable medium where the instructions when executed effect one or more operations of method 1000. Although specific operations are disclosed in method 1000, such operations are exemplary. Method 1000 may not include all of the operations illustrated by FIG. 10. Also, method 1000 may include various other operations and/or variations of the operations shown by FIG. 10. Likewise, the sequence of the operations of method 1000 can be modified. It is noted that the operations of method 1000 can be performed manually, by software, by firmware, by electronic hardware, or by any combination thereof.

Specifically, method 1000 can include preparing a first wafer for a wafer bonding process. An integrated circuit wafer can be prepared for the wafer bonding process. The wafer bonding process can be utilized to couple the first wafer and the integrated circuit wafer. Furthermore, the wafer bonding process can form a gap between the first wafer and the integrated circuit wafer that is for receiving a heat extracting material. Heat extracting material can be input into the gap between the first wafer and the integrated circuit wafer. The heat extracting material can be output from the gap between the first wafer and the integrated circuit wafer. In this manner, chip cooling channels can be formed and used in a wafer bonding gap, in accordance with various embodiments of the invention.

At operation 1002 of FIG. 10, a first wafer (e.g., cap wafer 102) can be prepared for a wafer bonding process. It is noted that operation 1002 can be implemented in a wide variety of ways. For example in one embodiment, the preparing of the first wafer at operation 1002 can include depositing one or more patches of a thin film of material (e.g., metal, silicon dioxide, etc.) above the first wafer. In an embodiment, the preparing of the first wafer at operation 1002 can include fabrication of the first wafer (e.g., in a manner similar to that described herein, but is not limited to such). In an embodiment, the first wafer can include a gap setting material for maintaining a distance between the first wafer and the integrated circuit wafer during the wafer bonding process. The first wafer of operation 1002 can be implemented in any manner similar to any wafer described herein, but is not limited to such. Operation 1002 can be implemented in any manner similar to that described herein, but is not limited to such.

At operation 1004, an integrated circuit wafer (e.g., 104) can be prepared for the wafer bonding process. It is pointed out that operation 1004 can be implemented in a wide variety of ways. For example in one embodiment, the preparing of the integrated circuit wafer at operation 1004 can include depositing one or more patches of a thin film of material (e.g., metal, silicon dioxide, etc.) above the integrated circuit wafer. In an embodiment, the preparing of the integrated circuit wafer at operation 1004 can include fabrication of the integrated circuit wafer (e.g., in a manner similar to that described herein, but is not limited to such). In an embodiment, the integrated circuit wafer can include a gap setting material for maintaining a distance between the first wafer and the integrated circuit wafer during the wafer bonding process. Operation 1004 can be implemented in any manner similar to that described herein, but is not limited to such.

At operation 1006 of FIG. 10, the wafer bonding process can be utilized to couple the first wafer and the integrated circuit wafer, wherein the wafer bonding process can form a gap between the first wafer and the integrated circuit wafer that is for receiving a heat extracting (e.g., coolant) material. Note that operation 1006 can be implemented in a wide variety of ways. For example in one embodiment, the wafer bonding process can include one or more bonds that couple the first wafer and the integrated circuit wafer, wherein the one or more bonds can also include electrical interconnects between the first wafer and the integrated circuit wafer. In an embodiment, the wafer bonding process of operation 1006 can form one or more channels within the gap between the first wafer and the integrated circuit wafer that is for receiving and directing a heat extracting (e.g., coolant) material. The wafer bonding process of operation 1006 can be implemented in any manner similar to that described herein, but is not limited to such. The heat extracting material (or coolant material) can be implemented in any manner similar to that described herein, but is not limited to such. Operation 1006 can be implemented in any manner similar to that described herein, but is not limited to such.

At operation 1008, heat extracting material can be input into the gap between the first wafer and the integrated circuit wafer. It is pointed out that operation 1008 can be implemented in a wide variety of ways. For example in various embodiments, the heat extracting material can be input into the gap between the first wafer and the integrated circuit wafer at operation 1008 in any manner similar to that described herein, but is not limited to such.

At operation 1010 of FIG. 10, the heat extracting material can be output from the gap between the first wafer and the integrated circuit wafer. It is noted that operation 1010 can be implemented in a wide variety of ways. For example in various embodiments, the heat extracting material can be output from the gap between the first wafer and the integrated circuit wafer at operation 1010 in any manner similar to that described herein, but is not limited to such.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A system comprising:
   a first wafer;
   a second wafer;
   a channel configured for receiving and directing a flow of heat extracting material through said channel, said channel comprising a first wall and a second wall opposite said first wall, said first wall comprising a side of said first wafer and said second wall comprising a side of said second wafer, said channel further comprising a distance between an entire length of said first and second wall, wherein said distance completely separates said first and second wafer; and
   a patterned bond material coupled with said first and second walls of said channel, said patterned bond material comprising:
      a gap-setting configuration configured for maintaining said distance; and
      a wall-like structure configuration forming one or more passages within said channel, said one or more passages configured for said receiving and directing a flow of heat extracting material through said channel; and
      at least one of a dielectric material and a wafer bonding interconnect material, wherein said heat extracting material comprises a fluid that has an index of refraction that enhances an optical performance of said system.

2. The system of claim 1, further comprising:
   an inlet pipe that is for inputting said heat extracting material into said channel between said first wafer and said second wafer.

3. The system of claim 1, further comprising:
   an outlet pipe that is for outputting said heat extracting material from said channel between said first wafer and said second wafer.

4. The system of claim 1, wherein said heat extracting material comprises a fluid.

5. The system of claim 1, wherein said patterned bond material enables a wafer bonding process to form said channel, said wafer bonding process is selected from the group consisting of eutectic bonding, solder bonding, compression bonding, fusion bonding, anodic bonding, plasma assisted bonding, and adhesive bonding.

6. The system of claim 1, wherein:
   said first wafer is an integrated circuit wafer; and
   said second wafer is selected from the group consisting of an optical wafer, a mechanical wafer, an electrical wafer, and a cap wafer.

7. The system of claim 1, wherein said first wafer comprises a shelf that comprises an electrical bond pad.

8. The system of claim 1, wherein said patterned bond material comprises:
   an electrical interconnect between said first wafer and said second wafer.

9. The system of claim 1, wherein said channel comprises a treated surface that has one or more purposes selected from the group consisting of controlling flow of said heat extracting material, controlling wetting of said heat extracting material, and preventing corrosion by said heat extracting material.

10. The system of claim 1, further comprising:
    an optical coupling that is for coupling an optical signal to said second wafer.

* * * * *